United States Patent
Anderson et al.

(10) Patent No.: US 11,853,225 B2
(45) Date of Patent: Dec. 26, 2023

(54) SOFTWARE-HARDWARE MEMORY MANAGEMENT MODES

(71) Applicant: TEXAS INSTRUMENTS INCORPORATED, Dallas, TX (US)

(72) Inventors: Timothy D. Anderson, University Park, TX (US); Joseph Raymond Michael Zbiciak, San Jose, CA (US); Kai Chirca, Dallas, TX (US); Daniel Brad Wu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/068,730

(22) Filed: Oct. 12, 2020

(65) Prior Publication Data

US 2021/0109868 A1    Apr. 15, 2021

Related U.S. Application Data

(60) Provisional application No. 62/914,061, filed on Oct. 11, 2019.

(51) Int. Cl.
| | | |
|---|---|---|
| *G06F 12/10* | (2016.01) | |
| *G06F 12/1027* | (2016.01) | |
| *G06F 12/0862* | (2016.01) | |
| *G06F 12/1009* | (2016.01) | |
| *G06F 9/48* | (2006.01) | |
| *G06F 9/46* | (2006.01) | |
| *G06F 12/0891* | (2016.01) | |
| *H03M 13/15* | (2006.01) | |
| *G06F 12/0882* | (2016.01) | |

(52) U.S. Cl.
CPC .......... *G06F 12/1027* (2013.01); *G06F 9/467* (2013.01); *G06F 9/4881* (2013.01); *G06F 12/0862* (2013.01); *G06F 12/0882* (2013.01); *G06F 12/0891* (2013.01); *G06F 12/1009* (2013.01); *H03M 13/1575* (2013.01); *G06F 2212/1021* (2013.01); *G06F 2212/602* (2013.01); *G06F 2212/68* (2013.01)

(58) Field of Classification Search
CPC ............. G06F 12/0862; G06F 12/0882; G06F 12/1009; G06F 12/1027; G06F 2212/68; G06F 9/467; G06F 9/4881; G06F 12/0891; G06F 2212/1021; G06F 2212/602; H03M 13/1575
USPC ....................................................... 711/154
See application file for complete search history.

(56) References Cited

U.S. PATENT DOCUMENTS

| | | |
|---|---|---|
| 8,438,572 B2 | 5/2013 | Fecioru |
| 10,635,591 B1 | 4/2020 | Venkatachar |
| 10,642,501 B1 * | 5/2020 | Patel ..................... G06F 9/4411 |

(Continued)

*Primary Examiner* — Hua J Song
(74) *Attorney, Agent, or Firm* — Brian D. Graham; Frank D. Cimino

(57) ABSTRACT

A method includes receiving, by a memory management unit (MMU) comprising a translation lookaside buffer (TLB) and a configuration register, a request from a processor core to directly modify an entry in the TLB. The method also includes, responsive to the configuration register having a first value, operating the MMU in a software-managed mode by modifying the entry in the TLB according to the request. The method further includes, responsive to the configuration register having a second value, operating the MMU in a hardware-managed mode by denying the request.

20 Claims, 5 Drawing Sheets

(56) References Cited

U.S. PATENT DOCUMENTS

| | | |
|---|---|---|
| 2013/0305250 A1 | 11/2013 | Durant |
| 2015/0242319 A1* | 8/2015 | Evans .................. G06F 12/109 |
| | | 711/207 |
| 2017/0090999 A1 | 3/2017 | Weber |
| 2017/0277634 A1* | 9/2017 | Basu .................... G06F 12/084 |
| 2018/0203804 A1* | 7/2018 | Kraemer ............... G06F 3/0673 |
| 2019/0332550 A1* | 10/2019 | Norman ............. G06F 12/0808 |
| 2020/0042348 A1 | 2/2020 | Acharya |
| 2020/0257635 A1 | 8/2020 | Park |
| 2020/0371951 A1 | 11/2020 | Chatterjee |

* cited by examiner

SOFTWARE-HARDWARE MEMORY MANAGEMENT MODES

CROSS-REFERENCE TO RELATED APPLICATIONS

The present application claims priority to U.S. Provisional Patent Application No. 62/914,061, which was filed Oct. 11, 2019, is titled "Memory Management Unit For A Processor," and is hereby incorporated herein by reference in its entirety.

BACKGROUND

Managing interactions between multiple software applications or program tasks and physical memory involves address translation (e.g., between a virtual address and a physical address or between a first physical address and a second physical address). Software applications or program task modules are generally compiled with reference to a virtual address space. When an application or task interacts with physical memory, address translation is performed to translate a virtual address into a physical address in the physical memory. Address translation consumes processing and/or memory resources. A cache of translated addresses, referred to as a translation lookaside buffer (TLB), improves address translation performance.

SUMMARY

In accordance with at least one example of the disclosure, a method includes receiving, by a memory management unit (MMU) comprising a translation lookaside buffer (TLB) and a configuration register, a request from a processor core to directly modify an entry in the TLB. The method also includes, responsive to the configuration register having a first value, operating the MMU in a software-managed mode by modifying the entry in the TLB according to the request. The method further includes, responsive to the configuration register having a second value, operating the MMU in a hardware-managed mode by denying the request.

In accordance with another example of the disclosure, a system includes a processor core and a memory management unit (MMU) coupled to the processor core and comprising a translation lookaside buffer (TLB) and a configuration register. The MMU is configured to receive, from the processor core, a request to directly modify an entry in the TLB; responsive to the configuration register having a first value, operate in a software-managed mode by modifying the entry in the TLB according to the request; and responsive to the configuration register having a second value, operate in a hardware-managed mode by denying the request.

In accordance with yet another example of the disclosure, an apparatus includes a memory management unit (MMU), which includes a translation lookaside buffer (TLB) and a configuration register. The configuration register having a first value causes the MMU to operate in a software-managed mode and the configuration register having a second value causes the MMU to operate in a hardware-managed mode. The MMU is configured to receive, from a processor core, a request to directly modify an entry in the TLB; responsive to the configuration register having a first value, operate in a software-managed mode by modifying the entry in the TLB according to the request; and responsive to the configuration register having a second value, operate in a hardware-managed mode by denying the request.

BRIEF DESCRIPTION OF THE DRAWINGS

For a detailed description of various examples, reference will now be made to the accompanying drawings in which.

DETAILED DESCRIPTION

Figure 1:
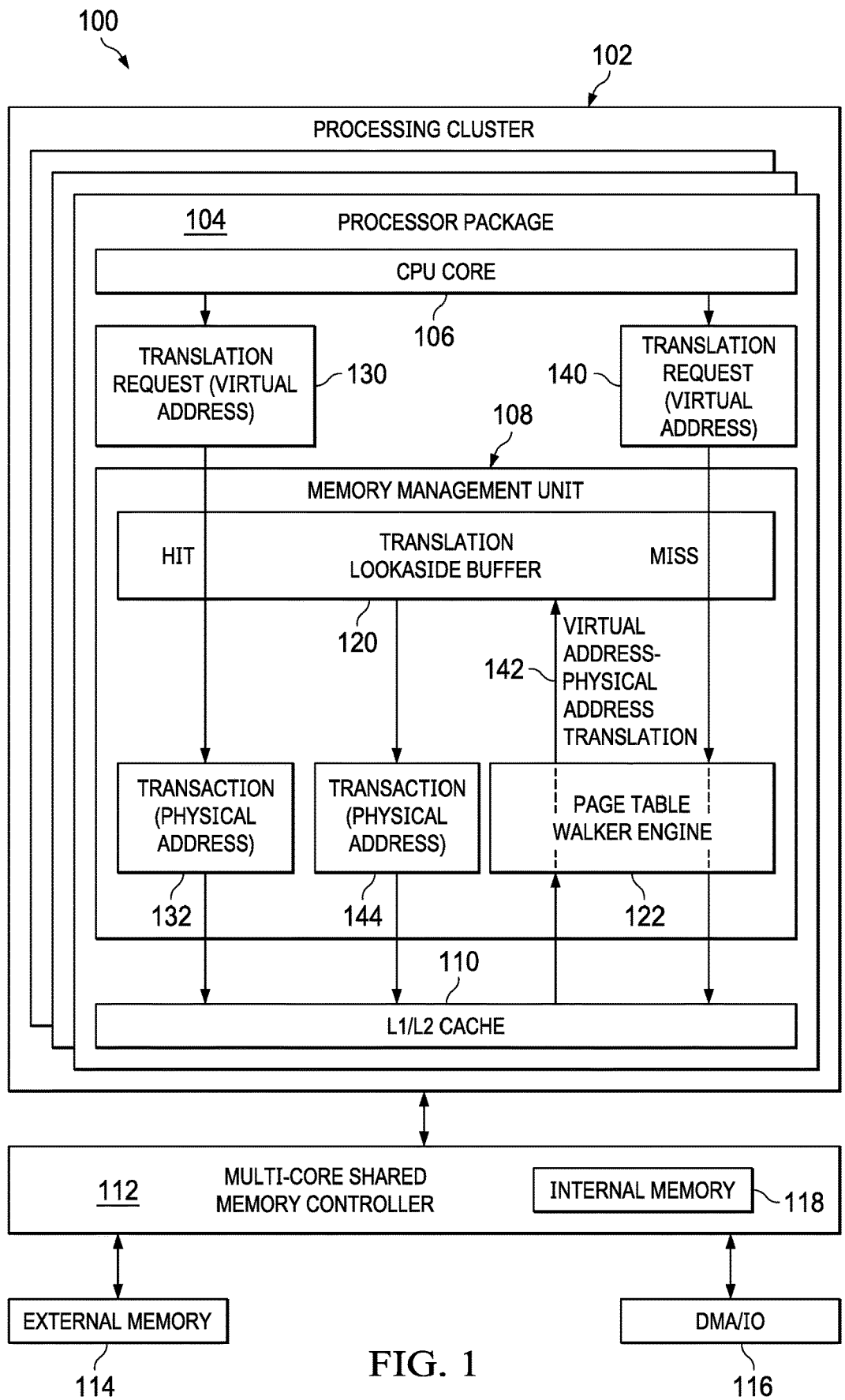
FIG. 1 is a block diagram of a multi-core processing system in accordance with various examples.

FIG. 1 is a functional block diagram of a multi-core processing system 100, in accordance with examples of this description. In one example, the system 100 is a multi-core system-on-chip (SoC) that includes a processing cluster 102 having one or more processor packages 104. In some examples, the one or more processor packages 104 include one or more types of processors, such as a central processor unit (CPU), graphics processor unit (GPU), digital signal processor (DSP), etc. In one example, a processing cluster 102 includes a set of processor packages split between DSP, CPU, and GPU processor packages. In some examples, each processor package 104 includes one or more processing cores 106. As used herein, the term "core" refers to a processing module that is configured to contain an instruction processor, such as a DSP or other type of microprocessor. Each processor package 104 also contains a memory management unit (MMU) 108 and one or more caches 110. In some example, the caches 110 include one or more level one (L1) caches and one or more level two (L2) caches. For example, a processor package 104 includes four cores 106, each core including an L1 data cache and L1 instruction cache, along with a L2 cache shared by the four cores 106.

The multi-core processing system 100 also includes a multi-core shared memory controller (MSMC) 112, which couples the processing cluster 102 to one or more external memories 114 and direct memory access/input/output (DMA/IO) clients 116. The MSMC 112 also includes an on-chip internal memory 118 that is directly managed by the MSMC 112. In certain examples, the MSMC 1112 manages traffic between multiple processor cores 106, other mastering peripherals or DMA clients 116 and allows processor packages 104 to dynamically share the internal and external memories for both program instructions and data. The MSMC internal memory 118 offers additional flexibility (e.g., to software programmers) because portions of the internal memory 118 are configured as a level 3 (L3) cache.

The MMU 108 is configured to perform address translation between a virtual address and a physical address, including intermediate physical addresses for multi-stage address translation. In some examples, the MMU 108 is also configured to perform address translation between a first physical address and a second physical address (e.g., as part of a multi-stage address translation). In particular, the MMU 108 helps to translate virtual memory addresses to physical memory addresses for the various memories of the system 100. The MMU 108 contains a translation lookaside buffer (TLB) 120 that is configured to store translations between addresses (e.g., between a virtual address and a physical address or between a first physical address and a second physical address). Although not shown for simplicity, in other examples the MMU 108 additionally includes a micro-TLB (uTLB), such as a fully associative uTLB, which, along with the TLB 120, serve as caches for page translations. In some examples, the TLB 120 also stores address pointers of page tables. In addition to address translations stored (e.g., cached) in the TLB 120, the MMU 108 includes one or more page table walker engines 122 that are configured to access or "walk" one or more page tables to translate a virtual address to a physical address, or to translate an intermediate physical address to a physical address. The function of the page table walker engine 122 is described further below.

The processor core 106 generates a transaction directed to a virtual address that corresponds to a physical address in memory (e.g., external memory 114). Examples of such transactions generated by the processor core 106 include reads from the memory 114 and writes to the memory 114; however, other types of transactions requiring address translation (e.g., virtual-to-physical address translation and/or physical-to-physical address translation) are also within the scope of this description. For ease of reference, any transaction that entails address translation is referred to as an address translation request (or "translation request"), and it is further assumed for simplicity that translation requests specify a virtual address to be translated to a physical address. The processor core 106 thus provides a translation request to the MMU 108.

Responsive to receiving a translation request from the processor core 106, the MMU 108 first translates the virtual address specified by the translation request to a physical address. A first example translation request 130 is provided by the processor core 106 to the MMU 108. The MMU 108 first determines whether the first translation request 130 hits the TLB 120 (e.g., the TLB 120 already contains the address translation for the virtual address specified by the first translation request 130). In this example, the first translation request 130 does hit the TLB 120, and thus the MMU 108 forwards a transaction 132 that includes the translated physical address to a lower level memory (e.g., the caches 110) for further processing.

A second example translation request 140 is provided by the processor core 106 to the MMU 108. The MMU 108 again determines whether the second translation request 140 hits the TLB 120. In this example, the second translation request 140 misses (e.g., does not hit) the TLB 120. Responsive to the second translation request 140 missing the TLB 120, the MMU 108 provides the second translation request 140 to its page table walker engine 122, which accesses (e.g., "walks") one or more page tables in a lower level memory (e.g., the caches 110, 118, or external memory 114) to translate the virtual address specified by the second translation request 140 to a physical address. The process of walking page tables is described in further detail below. Once the page table walker engine 122 translates the virtual address to a physical address, the address translation is stored in the TLB 120 (depicted as arrow 142), and the MMU 108 forwards a transaction 144 that includes the translated physical address to a lower level memory for further processing.

A third possibility exists, in which the translation request from the processor core 106 only partially hits the TLB 120. In such a situation, which will be described further below, the page table walker engine 122 still walks one or more page tables in the lower level memory to translate the virtual address specified by the translation request to a physical address. However, because the translation request partially hit the TLB 120, a reduced number of page tables are walked in order to perform the address translation relative to a translation request that completely misses the TLB 120.

Figure 2:
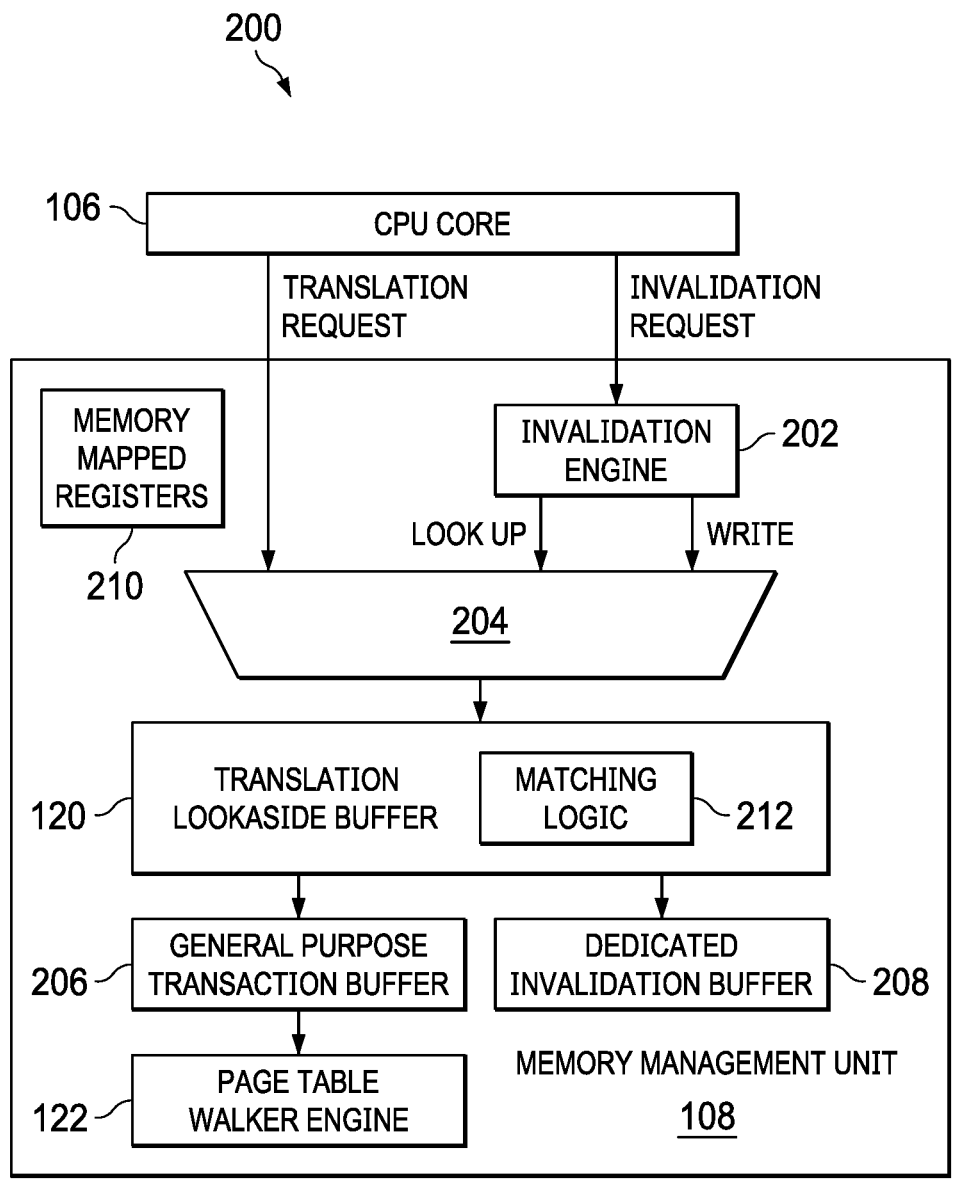
FIG. 2 is a block diagram showing a memory management unit (MMU) in greater detail and in accordance with various examples.

FIG. 2 is a block diagram of a system 200 that includes a processor core 106 and MMU 108, which itself includes the TLB 120 and page table walker engine 122, as described above. In the example of FIG. 2, the MMU 108 is shown in further detail and includes an invalidation engine 202, a transaction multiplexer (mux) 204, a general purpose transaction buffer 206, a dedicated invalidation buffer 208, and one or more memory mapped registers (MMRs) 210 that are used to control and/or configure various functionality of the MMU 108. In some examples, the TLB 120 includes multiple pipeline stages (shown as matching logic 212) that facilitate the TLB 120 receiving a translation request and determining whether the virtual address specified by the translation request hits the TLB 120, partially hits the TLB 120, or misses the TLB 120.

As described above, the processor core 106 is configured to provide various translation requests to the MMU 108, which are provided to the transaction mux 204 as shown. In some examples, the processor core 106 is configured to provide address invalidation requests (or "invalidation requests") to the MMU 108 in addition to the translation requests. Invalidation requests are requests to invalidate one or more entries in the TLB 120. In some examples, invalidation requests are for a single entry (e.g., associated with a particular virtual address) in the TLB 120, while in other examples, invalidation requests are for multiple entries (e.g., associated with a particular application ID) in the TLB 120. The invalidation requests are provided to the invalidation engine 202 of the MMU 108, which in turn forwards such invalidation requests to be looked up in the TLB 120 to the transaction mux 204 as shown. Regardless of the type of request, the transaction mux 204 is configured to pass both translation requests and invalidation requests to the TLB 120. In some examples, control logic provides control signals to the transaction mux 204 to select one of the inputs to the transaction mux 204 to be provided as the output of the transaction mux 204. In an example, address translation requests are prioritized over address invalidation requests until there are no more available spots in the general purpose transaction buffer 206 for such address translation requests.

Responsive to receiving a request (e.g., either a translation request or an invalidation request), the matching logic 212 (e.g., implemented by pipeline stages of the TLB 120) determines whether the request hits the TLB 120, partially hits the TLB 120, or misses the TLB 120.

Depending on the type of request, various resulting transactions are produced by the matching logic 212. For example, a translation request can hit the TLB 120, partially hit the TLB 120, or miss the TLB 120. An invalidation request can either hit the TLB 120 or miss the TLB 120, because an invalidation request that only partially hits an entry in the TLB 120 should not result in invalidating that entry in some examples. In other examples, an invalidation request can also partially hit the TLB 120. For example, a partial hit on the TLB 120 exists when a request hits on one or more pointers to page table(s), but does not hit on at least the final page table. A hit on the TLB 120 exists when a request hits on both the one or more pointers to page table(s) as well as the final page table itself. In some examples, an invalidation request includes a "leaf level" bit or field that specifies to the MMU 108 whether to invalidate only the final page table (e.g., partial hits on the TLB 120 do not result in invalidating an entry) or to invalidate pointers to page table(s) as well (e.g., a partial hit on the TLB 120 results in invalidating an entry).

Responsive to a translation request that hits the TLB 120, the MMU 108 provides an address transaction specifying a physical address to the general purpose transaction buffer 206. In this example, the general purpose transaction buffer 206 is a first-in, first-out (FIFO) buffer. Once the address transaction specifying the physical address has passed through the general purpose transaction buffer 206, the MMU 108 forwards that address transaction to a lower level memory to be processed.

Responsive to a translation request that partially hits the TLB 120 or misses the TLB 120, the MMU 108 provides an address transaction that entails further address translation to the general purpose transaction buffer 206. For example, if the translation request misses the TLB 120, the address transaction provided to the general purpose transaction buffer 206 entails complete address translation (e.g., by the page table walker engine 122). In another example, if the translation request partially hits the TLB 120, the address transaction provided to the general purpose transaction buffer 206 entails additional, partial address translation (e.g., by the page table walker engine 122). Regardless of whether the address transaction entails partial or full address translation, once the address transaction that entails additional translation has passed through the general purpose transaction buffer 206, the MMU 108 forwards that address transaction to the page table walker engine 122, which in turn performs the address translation.

Generally, performing address translation is more time consuming (e.g., consumes more cycles) than simply processing a transaction such as a read or a write at a lower level memory. Thus, in examples where multiple translation requests miss the TLB 120 or only partially hit the TLB 120 (e.g., entails some additional address translation be performed by the page table walker engine 122), the general purpose transaction buffer 206 can back up and become full. The processor core 106 is aware of whether the general purpose transaction buffer 206 is full and, responsive to the general purpose transaction buffer 206 being full, the processor core 106 temporarily stalls from sending additional translation requests to the MMU 108 until space becomes available in the general purpose transaction buffer Responsive to an invalidation look-up request that hits the TLB 120, the MMU 108 provides a transaction specifying that an invalidation match occurred in the TLB 120, referred to as an invalidation match transaction for simplicity. Responsive to the general purpose transaction buffer 206 having space available (e.g., not being full), the MMU 108 is configured to provide the invalidation match transaction to the general purpose transaction buffer 206. However, responsive to the general purpose transaction buffer 206 being full, the MMU 108 is configured to provide the invalidation match transaction to the dedicated invalidation buffer 208. In this example, the dedicated invalidation buffer 208 is also a FIFO buffer. As a result, even in the situation where the general purpose transaction buffer 206 is full (e.g., due to address translation requests missing or only partially hitting the TLB 120, and thus backing up in the general purpose transaction buffer 206), the processor core 106 is able to continue sending invalidation requests to the MMU 108 because the invalidation requests are able to be routed to the dedicated invalidation buffer 208, and thus are not stalled behind other translation requests.

Regardless of whether the invalidation match transaction is stored in the general purpose transaction buffer 206 or the dedicated invalidation buffer 208, once the invalidation match transaction passes through one of the buffers 206, 208, the invalidation match transaction is provided to the invalidation engine 202, which is in turn configured to provide an invalidation write transaction to the TLB 120 to invalidate the matched entry or entries. In an example, invalidation look-up requests that miss the TLB 120 are discarded (e.g., not provided to either the general purpose transaction buffer 206 or the dedicated invalidation buffer 208).

Figure 3A:
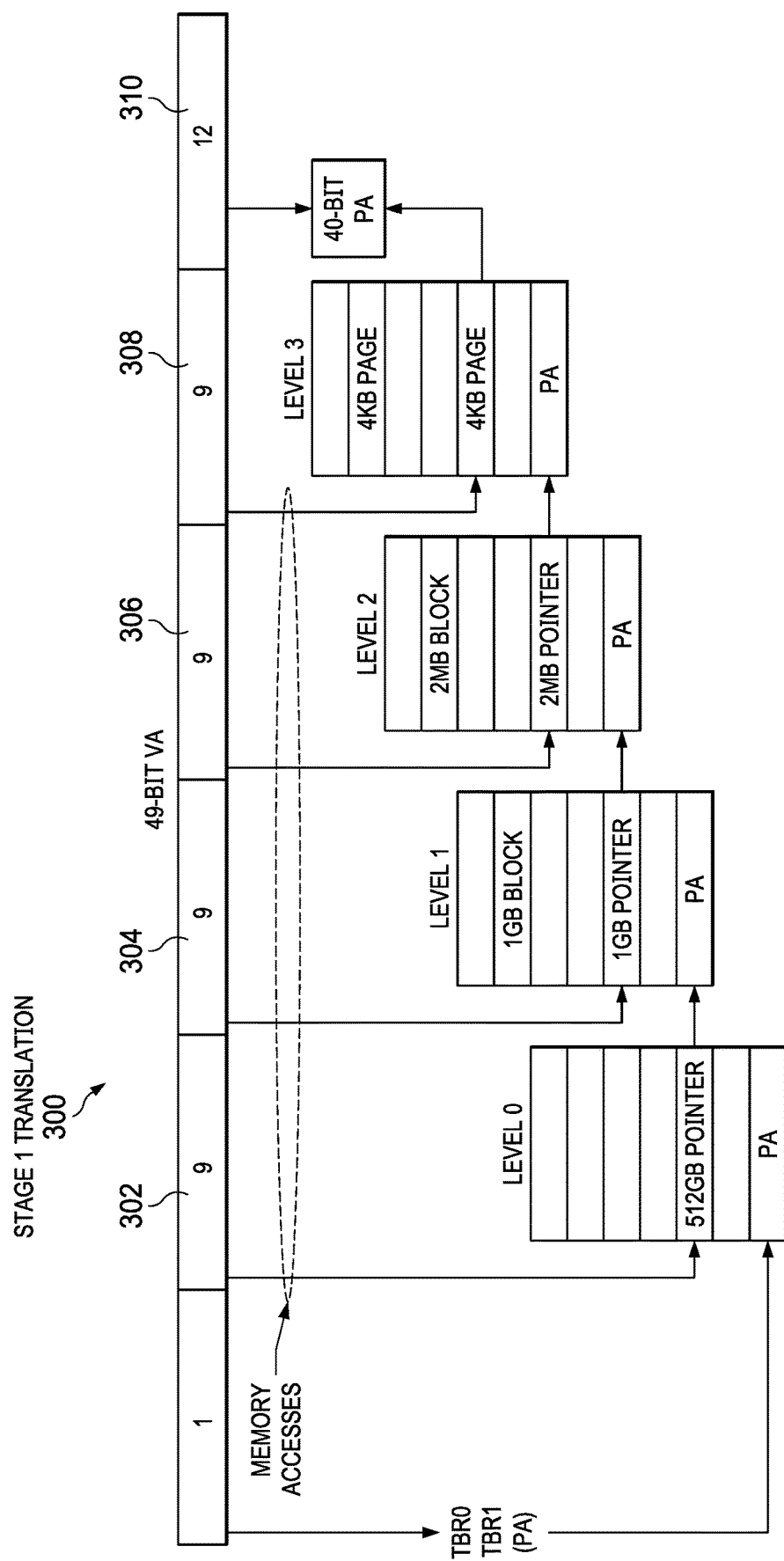
FIGS. 3a and 3b are examples of one- and two-stage address translation in accordance with various examples.

FIG. 3a is an example translation 300 for translating a 49-bit virtual address (VA) to a physical address (PA) in accordance with examples of this description. The example translation 300 is representative of the functionality performed by the page table walker engine 122 responsive to receiving a transaction that entails full or partial address translation.

In this example, the most significant bit of the 49-bit VA specifies one of two table base registers (e.g., TBR0 or TBR1, implemented in the MMRs 210). The table base registers each contain a physical address that is a base address of a first page table (e.g., Level 0). In this example, each page table includes 512 entries, and thus an offset into a page table is specified by nine bits. A first group of nine bits 302 provides the offset from the base address specified by the selected table base register into the Level 0 page table to identify an entry in the Level 0 page table. The identified entry in the Level 0 page table contains a physical address that serves as a base address of a second page table (e.g., Level 1).

A second group of nine bits 304 provides the offset from the base address specified by entry in the Level 0 page table into the Level 1 page table to identify an entry in the Level 1 page table. The identified entry in the Level 1 page table contains a physical address that serves as a base address of a third page table (e.g., Level 2).

A third group of nine bits 306 provides the offset from the base address specified by entry in the Level 1 page table into the Level 2 page table to identify an entry in the Level 2 page table. The identified entry in the Level 2 page table contains a physical address that serves as a base address of a fourth, final page table (e.g., Level 3).

A fourth group of nine bits 308 provides the offset from the base address specified by entry in the Level 2 page table into the Level 3 page table to identify an entry in the Level 3 page table. The identified entry in the Level 3 page table contains a physical address that serves as a base address of an exemplary 4 KB page of memory. The final 12 bits 310 of the VA provide the offset into the identified 4 KB page of memory, the address of which is the PA to which the VA is translated.

Figure 3B:
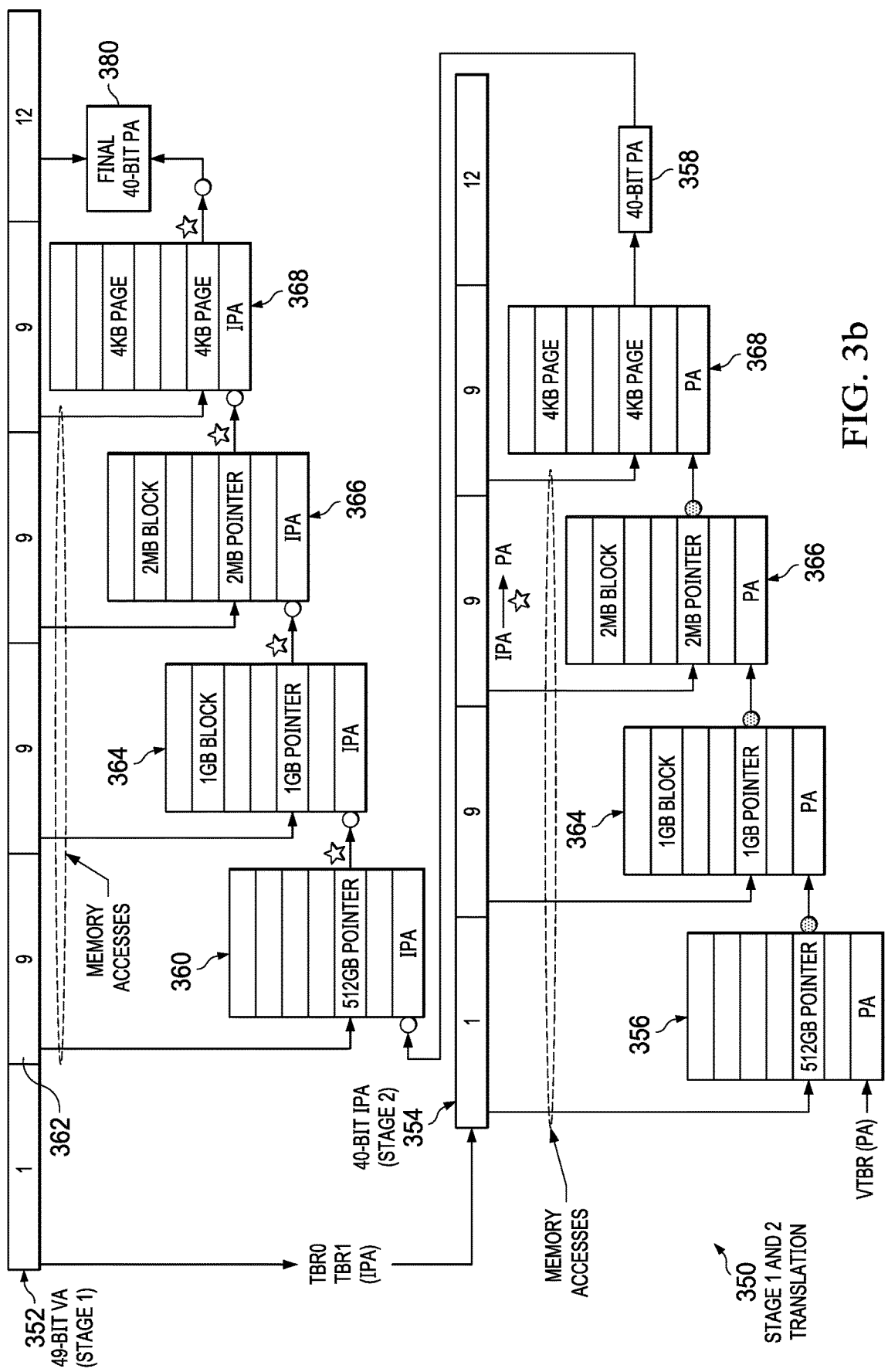

FIG. 3b is an example two-stage translation 350 for translating a 49-bit virtual address (VA) to a physical address (PA), including translating one or more intermediate physical addresses (IPA) in accordance with examples of this description. In an example, a value of one of the MMRs 210 of the MMU 108 is determinative of whether the MMU 108 is configured to perform one-stage translation as shown in FIG. 3a or two-stage translation as shown in FIG. 3b. The example translation 350 is representative of the functionality performed by the page table walker engine 122 responsive to receiving a transaction that entails full or partial address translation.

The two-stage translation 350 differs from the one-stage translation 300 described above in that the physical address at each identified entry is treated as an intermediate physical address that is itself translated to a physical address. For example, the most significant bit of the 49-bit VA 352 again specifies one of two table base registers (e.g., TBR0 or TBR1, implemented in the MMRs 210). However, the physical address contained by the selected table base register is treated as IPA 354, which is translated to a physical address. In this example, a virtual table base register (e.g., VTBR, implemented in the MMRs 210) contains a physical address that is a base address of a first page table 356. The remainder of the IPA 354 is translated as described above with respect to the 49-bit VA of FIG. 3a.

The resulting 40-bit PA 358 is a base address for a first page table 360 for the translation of the 49-bit VA 352 to the final 40-bit PA 380, while a first group of nine bits 362 of the VA 352 provides the offset from the base address specified by the PA 358 into the first page table 360 to identify an entry in the first page table 360. However, unlike the one-stage translation 300, the entry in the first page table 360 is treated as an IPA (e.g., replacing previous IPA 354) that is itself translated to a new PA 358, which is then used as a base address for a second page table 364. That is, the entry in the first page table 360 is not used directly as a base address for the second page table 364, but rather is first translated as an IPA 354 to a PA 358 and that resulting PA 358 is then used as the base address for the second page table 364. This process continues in a like manner for a third page table 366 and a fourth page table 368 before arriving at the final 40-bit PA 380. For example, the address contained in the final Level 3 page table (e.g., page table 368) is also an IPA that is translated in order to arrive at the final 40-bit PA 380.

Thus, while performing a one-stage translation 300 may entail multiple memory accesses, performing a two-stage translation 350 may entail still more memory accesses, which can reduce performance when many such translations are performed. Additionally, FIGS. 3a and 3b are described with respect to performing a full address translation. However, as described above, in some instances a translation request partially hits the TLB 120, for example where a certain number of most significant bits of a virtual address of the translation request match an entry in the TLB 120. In such examples, the page table walker engine 122 does not necessarily perform each level of the address translation and instead only performs part of the address translation. For example, referring to FIG. 3a, if the most significant 19 bits of a virtual address of a translation request match an entry in the TLB 120, the page table walker engine 122 begins with the base address of the Level 2 page table and only needs to perform address translation using the third and fourth groups of nine bits 306, 308. In other examples, similar partial address translations are performed with regard to a two-stage translation 350.

Figure 4:
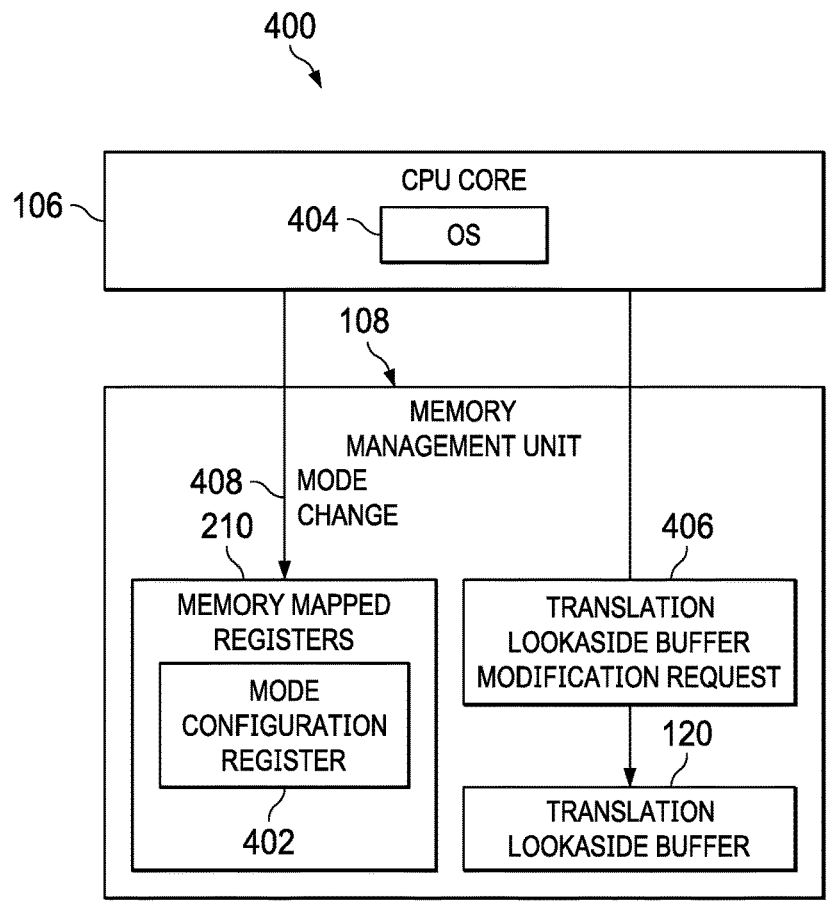
FIG. 4 is another block diagram showing the MMU in greater detail and in accordance with various examples.

FIG. 4 is a block diagram of a system 400 that includes the processor core 106 and the MMU 108 described above with respect to FIGS. 1 and 2. In the example of FIG. 4, the MMRs 210 of the MMU 108 include a mode configuration register 402. The MMU 108 is configured to operate in different modes responsive to the value of the mode configuration register 402. For example, responsive to the mode configuration register 402 being a first value, the MMU 108 is configured to operate in a software-managed mode. Responsive to the mode configuration register 402 being a second value, the MMU 108 is configured to operate in a hardware-managed mode. These modes are explained in further detail below.

In FIG. 4, the processor core 106 is schematically shown as including (e.g., executing) an operating system (OS) 404. In some cases, the OS 404 is a general purpose OS 400 that manages multiple applications, tasks, and the like. However, in other cases, the OS 404 is lower level (e.g., bare metal) software or an OS 404 that is more specifically tailored to a specific purpose (e.g., a real-time OS (RTOS)).

In some cases, lower level software such as bare metal software or a RTOS lacks of granular control over the management of memory attributes. For example, such lower level software is commonly unable to treat memory as cacheable; utilize address virtualization; specify whether memory is only readable, only writable; or the like. A lower level software or OS is also commonly unable to support different memory types at the same time, support memory having different page sizes, or provide control over memory access permissions. However, a higher level, general purpose OS has additional control over memory attributes, for example via table pages in a virtual memory system as described above.

In accordance with examples of this disclosure, the MMU 108 is configured to operate in the software-managed mode to allow a lower level OS 404 to utilize the MMU 108 and associated TLB 120. The MMU 108 is also configured to operate in the hardware-managed mode to allow general purpose OS 404 and its underlying applications and tasks to utilize the MMU 108 and associated TLB 120 and page table walker engine 122, for example as described above with respect to FIGS. 1, 2, 3a, and 3b.

Responsive to operating in the software-managed mode, the MMU 108 is configured to receive and grant a TLB modification request 406 from the processor core 106 to directly modify an entry in the TLB 120. The TLB modification request 406 specifies information needed to populate an entry in the TLB 120, such as a virtual address, a corresponding physical address (e.g., to which the virtual address translates), memory types (e.g., device memory, non-cacheable memory, cacheable writeback memory, cacheable write-through memory, and the like), memory attributes (e.g., shareability, whether memory is pre-fetchable, inner cacheability, outer cacheability, and the like), page size, permission(s) for the page (e.g., readable, writable, executable, a supervisor- or user-specific accessibility, demotion from secure to non-secure), a context security level, a privilege level, and the like. Thus, in the software-managed mode, the OS 404 is able to access TLB 120 entries in a manner similar to indexed (e.g., memory-mapped) control registers and populate or modify the values of those TLB 120 entries as needed. In some examples, the system 400 initially begins in software-managed mode with a flat, or default view of memory, in which entries in the TLB 120 have equivalent virtual address and physical address data. For example, when the TLB 120 initially contains such default entries, a virtual address that hits the TLB 120 results in a physical address that is identical to the virtual address.

By contrast, responsive to operating in the hardware-managed mode, the MMU 108 is configured to deny such a TLB modification request 406. In particular, in the hardware-managed mode, the TLB 120 is modified as described above (e.g., with respect to FIGS. 1 and 2), including receiving address translation requests from the processor core 106 and walking page tables (e.g., using the page table walker engine 122) to determine address translations, which are then cached in the TLB 120.

The MMU 108 is configured to receive address translation requests from the processor core 106 regardless of whether the MMU 108 is operating in the software-managed mode or the hardware-managed mode. In some examples, however, address translation requests are handled differently depending on whether the MMU 108 is operating in the software-managed mode or the hardware-managed mode.

For example, responsive to the MMU 108 operating in the software-managed mode and receiving an address translation request that misses the TLB 120 (e.g., a corresponding translation for a virtual address specified by the address translation request is not in the TLB 120), the MMU 108 is configured to return a memory fault to the processor core 106. A memory fault is returned to the processor core 106 in this case because it is assumed that a lower level OS 404 operating in software-managed mode is aware of the translations that it has caused to be populated in the TLB 120, and thus any address translation request for a virtual address that is not already in the TLB 120 is an inappropriate request that should result in a fault.

Continuing this example, responsive to the MMU 108 operating in the hardware-managed mode and receiving an address translation request that misses the TLB 120 (e.g., a corresponding translation for a virtual address specified by the address translation request is not in the TLB 120), the MMU 108 is configured to cause the page table walker engine 122, described above, to walk one or more page tables to determine an address translation for the specified virtual address. The MMU 108 is then configured to cache the determined address translation in the TLB 120 and/or a lower level memory such as the cache 110.

In some examples, the OS 404 or another process executed by the processor core 106 is configured to modify the mode configuration register 402 (e.g., to switch from software-managed mode to hardware-managed mode or vice versa) by providing a mode change request 408 to the MMU 108. This allows context switching between lower level processes (e.g., a lower level OS 404 in software-managed mode) and higher level processes (e.g., a higher level OS 404 in hardware-managed mode) on the same processor core 106. In these examples, only an OS 404 or other process having at least a certain privilege or context status is capable of modifying (e.g., writing to) the mode configuration register 402. As a result, lower privilege or lower context processes (e.g., a non-secure user mode process) are restricted from modifying the mode configuration register 402. For example, the MMU 108 is configured to process (e.g., grant) a mode change request 408 received from a process having a sufficient privilege level and to not process (e.g., deny) a mode change request 408 received from a process having an insufficient privilege level.

In some examples, responsive to switching from software-managed mode to hardware-managed mode, the MMU 108 is configured to invalidate TLB 120 entries used in the software-managed mode. Subsequently, when the MMU 108 operates in the hardware-managed mode, the TLB 120 is repopulated as described above, for example using the page table walker engine 122 to walk one or more page tables to determine address translations and caching the resulting address translations in the TLB 120. In these examples, the mode configuration register 402 (or another MMR 210) specifies whether to invalidate TLB 120 entries when switching from software-managed mode to hardware-managed mode.

Similarly, responsive to switching from hardware-managed mode to software-managed mode, the MMU 108 is configured to invalidate TLB 120 entries used in the hardware-managed mode. However, as explained above, in software-managed mode, the TLB 120 may be expected to begin in a default state in which entries in the TLB 120 have equivalent virtual address and physical address data. For example, when the TLB 120 initially contains such default entries, a virtual address that hits the TLB 120 results in a physical address that is identical to the virtual address. Thus, after invalidating the TLB 120 entries responsive to switching to software-managed mode, the MMU 108 is configured to populate the TLB 120 with default entries to enable such flat device memory at an initial time. In these examples, the mode configuration register 402 (or another MMR 210) specifies whether to invalidate TLB 120 entries and populate with default entries when switching from hardware-managed mode to software-managed mode. In some examples, the mode configuration register 402 (or another MMR 210) also specifies an amount of default memory space, which indicates to the MMU 108 a number of TLB 120 entries to populate as default entries. The default entries populated in the TLB 120 provide a contiguous address space in which the translated physical address is the same as the virtual address used by the processor core 106.

In other examples, responsive to switching from software-managed mode to hardware-managed mode, the MMU 108 is configured to retain TLB 120 entries used in the software-managed mode. The retained TLB 120 entries are "pinned" or otherwise marked so that they are not visible and/or accessible by processes that access the MMU 108 when subsequently operating in the hardware-managed mode. Similarly, responsive to switching from hardware-managed mode to software-managed mode, the MMU 108 is configured to retain TLB 120 entries used in the hardware-managed mode. The retained TLB 120 entries are "pinned" or otherwise marked so that they are not visible and/or accessible by processes that access the MMU 108 when subsequently operating in the software-managed mode. In these examples, the mode configuration register 402 (or another MMR 210) specifies whether to retain TLB 120 entries when switching from hardware-managed mode to software-managed mode or vice versa. The ability to retain TLB 120 entries used in a previous mode facilitates faster start-up times when switching between software- and hardware-managed modes, and vice versa, since fewer address translations need to be initially performed when switching to hardware-managed mode, or programmed into the TLB 120 in software-managed mode.

Figure 5:
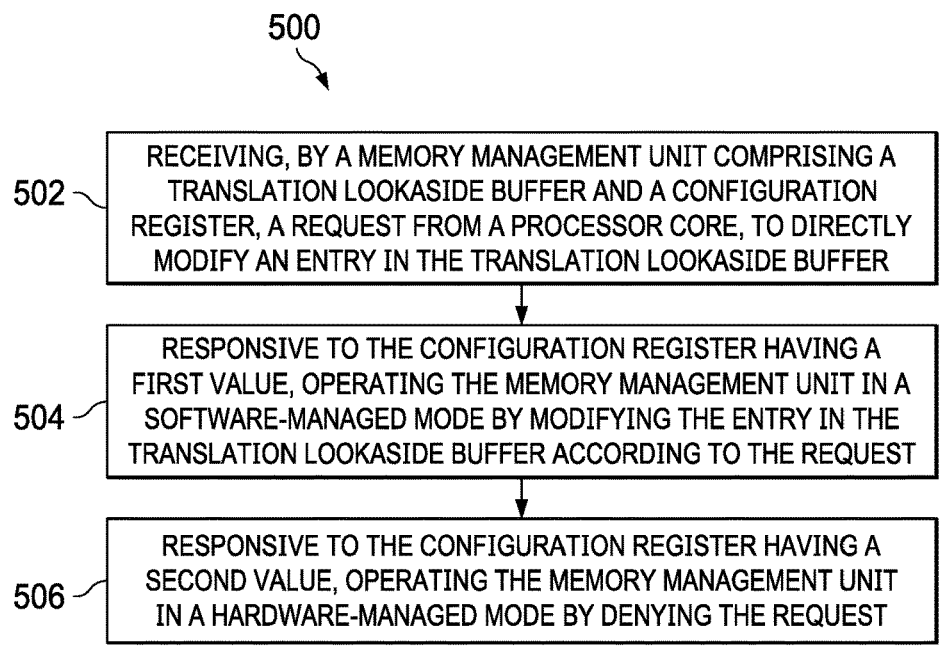
FIG. 5 is a flow chart of a method of operating the MMU in software- and hardware-managed modes in accordance with various examples.

FIG. 5 is a flow chart of a method 500 of operating the MMU 108 in software- and hardware-managed modes in accordance with various examples.

The method 500 begins in block 502 with receiving, by the MMU 108 (e.g., including the TLB 120 and mode configuration register 402), a request from the processor core 106 to directly modify an entry in the TLB 120 (e.g., TLB modification request 406). The TLB modification request 406 specifies information needed to populate an entry in the TLB 120, such as a virtual address, a corresponding physical address (e.g., to which the virtual address translates), and the like.

The method 500 then continues in block 504 with, responsive to the mode configuration register 402 having a first value, operating the MMU 108 in a software-managed mode by modifying the entry in the TLB 120 according to the request. Thus, in the software-managed mode, an OS or other supervisory program executed by the processor core 106 is able to access TLB 120 entries in a manner similar to indexed (e.g., memory-mapped) control registers and populate or modify the values of those TLB 120 entries as needed.

The method 500 continues further in block 506 with, responsive to the mode configuration register 402 having a second value, operating the MMU 108 in a hardware-managed mode by denying the request. As described above, in the hardware-managed mode, the TLB 120 is modified by receiving address translation requests from the processor core 106 and walking page tables (e.g., using the page table walker engine 122) to determine address translations, which are then cached in the TLB 120.

In the foregoing discussion and in the claims, the terms "including" and "comprising" are used in an open-ended fashion, and thus mean "including, but not limited to . . . ."

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is illustrative of the principles and various embodiments of the present disclosure. Numerous variations and modifications will become apparent to those skilled in the art once the above disclosure is fully appreciated. The following claims should be interpreted to embrace all such variations and modifications.

What is claimed is:

1. A method, comprising:
    receiving, by a memory management unit (MMU) comprising a translation lookaside buffer (TLB) and a configuration register, a first request from a processor core to directly modify an entry in the TLB, wherein the first request specifies a virtual address and a physical address that corresponds to the virtual address;
    responsive to the configuration register having a second value, operating the MMU in a software-managed mode by modifying the entry in the TLB according to the first request to indicate the virtual address and the physical address;
    responsive to the configuration register having a first value, operating the MMU in a hardware-managed mode by denying the first request;
    receiving, by the MMU, a second request from the processor core to update the configuration register from the second value to the first value; and
    responsive to the second request, transitioning to the software-managed mode by invalidating the TLB and populating a default entry in the TLB.

2. The method of claim 1, wherein the first request to directly modify the entry in the TLB further specifies one or more attributes selected from the group consisting of: a memory attribute, a memory type, a page size, and a page permission.

3. The method of claim 1, wherein:
    the virtual address is a first virtual address; and
    the method further comprises:
        receiving, by the MMU, an address translation request from the processor core;
        determining whether an address translation for a second virtual address specified by the address translation request is present in the TLB;
        responsive to the address translation for the second virtual address not being present in the TLB and the MMU operating in the software-managed mode, returning a memory fault to the processor core; and
        responsive to the address translation for the second virtual address not being present in the TLB and the MMU operating in the hardware-managed mode, walking one or more page tables to determine the address translation for the second virtual address.

4. The method of claim 3, further comprising, responsive to the address translation for the second virtual address not being present in the TLB and the MMU operating in the hardware-managed mode, caching the determined address translation in the TLB.

5. The method of claim 1, further comprising:
    receiving, by the MMU, a request from the processor core to update the configuration register from the first value to the second value; and
    responsive to the request to update the configuration register to the second value, transitioning to the hardware-managed mode by invalidating the TLB.

6. The method of claim 1, further comprising:
    receiving, by the MMU, a third request from the processor core to update the configuration register from the first value to the second value; and
    responsive to the third request to update the configuration register to the second value and to the configuration register or a second configuration register indicating to retain TLB entries, transitioning to the hardware-managed mode by pinning entries of the TLB used during the software-managed mode.

7. A method, comprising:
    receiving, by a memory management unit (MMU) comprising a translation lookaside buffer (TLB) and a configuration register, a first request from a processor core to directly modify an entry in the TLB, wherein the first request specifies a virtual address and a physical address that corresponds to the virtual address;
    responsive to the configuration register having a second value, operating the MMU in a software-managed mode by modifying the entry in the TLB according to the first request to indicate the virtual address and the physical address;
    responsive to the configuration register having a first value, operating the MMU in a hardware-managed mode by denying the first request;
    receiving, by the MMU, a second request from the processor core to update the configuration register from the second value to the first value; and
    responsive to the second request and to the configuration register or a second configuration register indicating to retain TLB entries, transitioning to the software-managed mode by pinning entries of the TLB used during the hardware-managed mode.

8. The method of claim 7, wherein:
    the virtual address is a first virtual address; and
    the method further comprises:
        receiving, by the MMU, an address translation request from the processor core;

determining whether an address translation for a second virtual address specified by the address translation request is present in the TLB;

responsive to the address translation for the second virtual address not being present in the TLB and the MMU operating in the software-managed mode, returning a memory fault to the processor core; and responsive to the address translation for the second virtual address not being present in the TLB and the MMU operating in the hardware-managed mode, determining the address translation for the second virtual address by walking a page tables.

9. A system, comprising:

a processor core; and a memory management unit (MMU) coupled to the processor core and comprising a translation lookaside buffer (TLB) and a configuration register, the MMU configured to:

receive, from the processor core, a first request to directly modify an entry in the TLB, wherein the first request specifies a virtual address and a physical address;

responsive to the configuration register having a first value, operate in a software-managed mode by modifying the entry in the TLB according to the first request to indicate the virtual address and the physical address;

responsive to the configuration register having a second value, operate in a hardware-managed mode by denying the first request;

receive a second request from the processor core to update the configuration register from the second value to the first value; and responsive to the second request, transition to the software-managed mode by invalidating the TLB and populating a default entry in the TLB.

10. The system of claim 9, wherein the first request further specifies one or more attributes selected from the group consisting of: a memory attribute, a memory type, a page size, and a page permission.

11. The system of claim 9, wherein:

the virtual address is a first virtual address; and the MMU is further configured to:

receive an address translation request from the processor core;

determine whether an address translation for a second virtual address specified by the address translation request is present in the TLB;

responsive to the address translation for the second virtual address not being present in the TLB and the MMU being configured to operate in the software-managed mode, return a memory fault to the processor core; and responsive to the address translation for the second virtual address not being present in the TLB and the MMU being configured to operate in the hardware-managed mode, walk one or more page tables to determine the address translation for the second virtual address.

12. The system of claim 11, wherein the MMU is further configured to, responsive to the address translation for the second virtual address not being present in the TLB and the MMU being configured to operate in the hardware-managed mode, cache the determined address translation in the TLB.

13. The system of claim 9, wherein the MMU is further configured to:

receive a request from the processor core to update the configuration register from the first value to the second value; and responsive to the request to update the configuration register to the second value, transition to the hardware-managed mode by invalidating the TLB.

14. The system of claim 9, wherein the MMU is further configured to:

receive a third request from the processor core to update the configuration register from the first value to the second value; and responsive to the third request to update the configuration register to the second value and to the configuration register or a second configuration register indicating to retain TLB entries, transition to the hardware-managed mode by pinning entries of the TLB used during the software-managed mode.

15. A system, comprising:

a processor core; and a memory management unit (MMU) coupled to the processor core and comprising a translation lookaside buffer (TLB) and a configuration register, the MMU configured to:

receive, from the processor core, a first request to directly modify an entry in the TLB, wherein the first request specifies a virtual address and a physical address;

responsive to the configuration register having a first value, operate in a software-managed mode by modifying the entry in the TLB according to the first request to indicate the virtual address and the physical address;

responsive to the configuration register having a second value, operate in a hardware-managed mode by denying the first request;

receive a second request from the processor core to update the configuration register from the second value to the first value; and responsive to the second request and to the configuration register or a second configuration register indicating to retain TLB entries, transition to the software-managed mode by pinning entries of the TLB used during the hardware-managed mode.

16. The system of claim 15, wherein:

the virtual address is a first virtual address; and the MMU is further configured to:

receive an address translation request from the processor core;

determine whether an address translation for a second virtual address specified by the address translation request is present in the TLB;

responsive to the address translation for the second virtual address not being present in the TLB and the MMU being configured to operate in the software-managed mode, return a memory fault to the processor core; and responsive to the address translation for the second virtual address not being present in the TLB and the MMU being configured to operate in the hardware-managed mode, determine the address translation for the second virtual address by walking a page table.

17. The system of claim 16, wherein the MMU is further configured to, responsive to the address translation for the second virtual address not being present in the TLB and the MMU being configured to operate in the hardware-managed mode, cache the address translation in the TLB.

18. An apparatus, comprising:
a memory management unit (MMU) including:
  a translation lookaside buffer (TLB); and
  a configuration register;
  wherein the MMU is configured to:
    receive, from a processor core, a first request to directly modify an entry in the TLB, wherein the first request specifies that a physical address corresponds to a virtual address;
    responsive to the configuration register having a first value, operate in a software-managed mode by modifying the entry in the TLB according to the first request to indicate that the physical address corresponds to the virtual address;
    responsive to the configuration register having a second value, operate in a hardware-managed mode by denying the first request;
    receive a second request from the processor core to update the configuration register from the second value to the first value; and
    responsive to the second request, transition to the software-managed mode by invalidating the TLB and populating a default entry in the TLB.

19. The apparatus of claim 18, wherein:
the virtual address is a first virtual address; and
the MMU is further configured to:
  receive an address translation request from the processor core;
  determine whether an address translation for a second virtual address specified by the address translation request is present in the TLB;
  responsive to the address translation for the second virtual address not being present in the TLB and the MMU being configured to operate in the software-managed mode, return a memory fault to the processor core; and
  responsive to the address translation for the second virtual address not being present in the TLB and the MMU being configured to operate in the hardware-managed mode, walk one or more page tables to determine the address translation for the second virtual address.

20. The apparatus of claim 19, wherein the MMU is further configured to, responsive to the address translation for the second virtual address not being present in the TLB and the MMU being configured to operate in the hardware-managed mode, cache the determined address translation in the TLB.

* * * * *